United States Patent
Ishii et al.

(10) Patent No.: US 7,692,564 B2
(45) Date of Patent: Apr. 6, 2010

(54) SERIAL-TO-PARALLEL CONVERSION CIRCUIT AND METHOD OF DESIGNING THE SAME

(75) Inventors: Shigeru Ishii, Aichi-ken (JP); Masaharu Nomachi, Osaka (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 112 days.

(21) Appl. No.: 12/216,753

(22) Filed: Jul. 10, 2008

(65) Prior Publication Data
US 2009/0015449 A1    Jan. 15, 2009

(30) Foreign Application Priority Data
Jul. 12, 2007    (JP)    ............................. 2007-183444

(51) Int. Cl.
*H03M 9/00*    (2006.01)
(52) U.S. Cl. ...................................... 341/100
(58) Field of Classification Search .................. 341/100
See application file for complete search history.

(56) References Cited

U.S. PATENT DOCUMENTS

| | | | | |
|---|---|---|---|---|
| 5,341,371 A | | 8/1994 | Simpson | |
| 5,911,062 A | * | 6/1999 | Taki | 713/400 |
| 5,961,616 A | * | 10/1999 | Wakasugi et al. | 710/65 |
| 6,509,851 B1 | * | 1/2003 | Clark et al. | 341/100 |
| 7,139,344 B2 | * | 11/2006 | Crutchfield et al. | 375/354 |
| 7,528,748 B2 | * | 5/2009 | Ohara | 341/101 |
| 2001/0036227 A1 | * | 11/2001 | Matsuo et al. | 375/224 |
| 2004/0037383 A1 | * | 2/2004 | Song | 375/371 |
| 2007/0258292 A1 | * | 11/2007 | Irisawa et al. | 365/189.05 |

OTHER PUBLICATIONS

European Search Report dated Jul. 14, 2009, issued in corresponding European Patent Application No. 08160241.9.

* cited by examiner

*Primary Examiner*—Howard Williams
(74) *Attorney, Agent, or Firm*—Westerman, Hattori, Daniels & Adrian, LLP

(57) ABSTRACT

The invention eliminates a race condition without restricting reception speed. The invention provides a method of designing a serial-to-parallel conversion circuit, the method including determining a rule for data and a strobe when a first-stage memory device in a shift register latches data and when the memory device holds the data; providing a logical circuit for generating an output conforming to the rule at a data input side of the shift register; and shifting a data latch timing of the memory device by a half-period.

11 Claims, 16 Drawing Sheets

| D | S | Z(T) |
|---|---|---|
| 0 | 0 | Z (T−1) |
| 0 | 1 | 0 |
| 1 | 0 | 1 |
| 1 | 1 | Z (T−1) |

| S | R | Q(T) |
|---|---|------|
| 0 | 0 | 1 |
| 0 | 1 | 1 |
| 1 | 0 | 0 |
| 1 | 1 | Q (T−1) |

| R | S | Q(T) |
|---|---|------|
| 0 | 0 | Q(T−1) |
| 0 | 1 | 1 |
| 1 | 0 | 0 |
| 1 | 1 | 0 |

| D | S | Z(T) |
|---|---|------|
| 0 | 0 | 0 |
| 0 | 1 | Z (T−1) |
| 1 | 0 | Z (T−1) |
| 1 | 1 | 1 |

FIG. 14

```
rx_clk <= SpW_S xor SpW_D;

FF0 <=
      '1' when SpW_D = '1' and SpW_S = '1' else
      '0' when SpW_D = '0' and SpW_S = '0' else
      FF0;

process(rx_clk) begin
      if rx_clk'event and rx_clk='1' then
            FF2 <= FF0;
      end if;
end process;
```

SERIAL-TO-PARALLEL CONVERSION CIRCUIT AND METHOD OF DESIGNING THE SAME

BACKGROUND OF THE INVENTION

1. Field of the Invention

The present invention relates to a serial-to-parallel conversion circuit that regenerates a clock signal at a receiving end on the basis of data and a strobe, to perform decoding.

This application is based on Japanese Patent Application No. 2007-183444, the content of which is incorporated herein by reference.

2. Description of Related Art

IEEE 1355 is a conventional known interface standard for space-based devices. Recently, "SpaceWire" has also been proposed as a next-generation interface standard for space-based devices. SpaceWire is a derivative of IEEE 1355 proposed by the European Space Agency (ESA) as a standard for space applications; it is also known as IEEE 1355.2 (for example, see U.S. Pat. No. 5,341,371).

For terrestrial applications, the IEEE 1394 high-speed serial bus is widely used as an interface suitable for connecting together audio-visual equipment, personal computer peripherals, etc.

In IEEE 1355, IEEE 1355.2, IEEE 1394, and similar standards, a clock at the transmission end is recreated at the receiving end from two signals, "data" and "strobe", sent from the transmission end; therefore, it is not necessary to synchronize the clocks at the transmission and receiving ends, which makes it possible to construct systems at low cost. In addition, these systems offer advantages because of their variable data transmission rate, such as compatibility with various devices.

FIG. 15 shows an example configuration of a serial-to-parallel conversion circuit used in the above-mentioned standards. In this serial-to-parallel conversion circuit, a clock CLK is generated by taking the exclusive OR of "data D" and "strobe S" received from the transmission end. The clock CLK is then input to multiple stages of flip-flops FF0, FF1, . . . , FFn constituting a shift register 100.

Accordingly, the input data ("Data" in FIG. 16) is latched in the flip-flop FF0, provided at the first stage of the shift register 100, at the rising edge of the clock CLK.

When implementing a conventional serial-to-parallel conversion circuit, such as that shown in FIG. 15, in an actual circuit, a delay occurs until the clock CLK and the input Data are input to the flip-flop FF0. As shown in FIG. 17, there is no problem so long as the clock CLK arrives at the flip-flop FF0 after the input Data changes; however, as shown in FIG. 18, if the clock CLK arrives at the flip-flop FF0 before the input Data changes, the Data level before the change becomes latched in the flip-flop FF0, resulting in a so-called race condition, where the original data to be latched differs from the data actually latched.

One way to eliminate the race condition problem is to input the clock CLK to the flip-flop FF0 via a delay circuit. However, if the serial-to-parallel conversion circuit described above were implemented with general-purpose programmable semiconductor devices, such as CPLDs (Complex PLDs) or FPGAs (Field Programmable Gate Arrays), it would be difficult to provide a delay circuit.

Moreover, when the phase of the clock CLK is delayed by providing a delay circuit, the shortest bit period of the received data is limited by the amount of delay of the clock CLK by the delay circuit. This is a problem because the maximum reception speed is also limited by the amount of delay of the clock CLK.

BRIEF SUMMARY OF THE INVENTION

An object of the present invention is to provide a method of designing a serial-to-parallel conversion circuit, a serial-to-parallel conversion circuit designed thereby, and a communication device in which a race condition can be eliminated without limiting the reception speed.

A first aspect of the present invention is a method of designing a serial-to-parallel conversion circuit including a clock generator configured to generate a clock by taking the exclusive OR of received data and a strobe, and a register group including a plurality of memory devices sequentially latching the data in synchronization with a rising edge and a falling edge of the clock, the method including determining a rule on the basis of the fact that logical values of the data and the strobe are guaranteed not to change substantially simultaneously when the memory devices of the register group latch the data and when the memory devices hold the data; providing a logical circuit configured to generate an output conforming to the rule at a data input side of the register group; and delaying data latch timing of the memory devices later than timing at which data input to the memory devices changes.

The inventors discovered that there is a rule between the data and strobe latched in a register group in a serial-to-parallel conversion circuit generating a clock at the receiving end by taking the exclusive OR of the received data and strobe. Features of the present invention, achieved by focusing on this rule, are the ability to increase the data reception speed and to eliminate a race condition.

In other words, with this method, because the operating rule of the memory device is obtained and a logical circuit for generating an output conforming to this rule is provided at the data input side of the register group, it is possible to set a long valid period for the data input from the logical circuit to the memory device. (For example, whereas the conventional period is half the clock period, it is one full clock period in the present invention; that is, the valid period of the data is twice as long as the conventional period.) Accordingly, even when providing the same type of delay circuits as those used conventionally in the clock as anti-race measures, it is possible to convert serial data with a higher speed than in the conventional approach into parallel data.

In the method of designing a serial-to-parallel conversion circuit described above, when the memory device initially receiving a signal in the register group latches the data at the rising edge of the clock, the logical circuit may output 0 when the data is 0 and the strobe is 1, may output 1 when the data is 1 and the strobe is 0, and may output a previous value when the data and the strobe are both 0 or both 1.

In the method of designing a serial-to-parallel conversion circuit described above, when the memory device initially receiving a signal in the register group latches the data at the falling edge of the clock, the logical circuit may output 0 when the data is 0 and the strobe is 0, may output 1 when the data is 1 and the strobe is 1, and may output a previous value when the data and the strobe have different values from each other.

The method of designing a serial-to-parallel conversion circuit described above, may further include setting a timing at which an output from the logical device is latched by the memory device to an edge after a half-period of the clock generated by taking the exclusive OR of the received data and strobe.

By doing so, a delay circuit becomes unnecessary, and it is thus possible to realize higher speed serial-to-parallel conversion.

A second aspect of the present invention is a serial-to-parallel conversion circuit including a clock generator configured to generate a clock by taking the exclusive OR of received data and strobe; a register group including a plurality of memory devices and configured to sequentially latch the data in synchronization with a rising edge and a falling edge of the clock; and a logical circuit, provided at a data input side of the register group, configured to generate an output conforming to a rule based on the fact that logical values of the data and the strobe are guaranteed not to change substantially simultaneously when the memory devices of the register group latch the data and when the memory devices hold the data. Additionally, data latch timing of the memory devices is delayed later than timing at which data output from the logical circuit changes.

With this configuration, because the operating rule of the memory device is obtained in advance and a logical circuit for generating an output conforming to this rule is provided at the data input side of the register group, it is possible to set a long valid period for the data input from the logical circuit to the memory device. (For example, whereas the conventional period is half the clock period, it is one full clock period in the present invention; that is, the valid period of the data is twice as long as the conventional period.) Accordingly, even when providing the same type of delay circuits as those used conventionally as anti-race measures for the clock, it is possible to convert serial data with a higher speed than in the conventional approach into parallel data.

In particular, when using the serial-to-parallel conversion circuit in a communication device, because the time required for the memory device in the serial-to-parallel conversion circuit to latch the data is a rate-limiting point for the communication speed, it is possible to increase the communication speed (bit rate) by approximately a factor of two.

In the serial-to-parallel conversion circuit described above, a timing at which the output from the logical circuit is latched by the memory devices may be set to an edge after a half-period of the clock generated by taking the exclusive OR of the received data and strobe.

By doing so, a delay circuit becomes unnecessary, and it is thus possible to realize higher speed serial-to-parallel conversion.

In the serial-to-parallel conversion circuit described above, when the memory device initially receiving a signal in the register group latches the data at the rising edge of the clock, the logical circuit may output 0 when the data is 0 and the strobe is 1, may output 1 when the data is 1 and the strobe is 0, and may output a previous value when the data and the strobe are both 0 or both 1.

In the serial-to-parallel conversion circuit described above, when the memory device initially receiving a signal in the register group latches data at the falling edge of the clock, the logical circuit may output 0 when the data is 0 and the strobe is 0, may output 1 when the data is 1 and the strobe is 1, and may output a previous value when the data and the strobe have different values from each other.

A third aspect of the present invention is a serial-to-parallel conversion circuit including a clock generator configured to generate a clock by taking the exclusive OR of received data and a strobe; a first register group including a plurality of memory devices, at least the memory device to which a signal is initially input being configured to latch the data at the falling edge of the clock; a second register group including a plurality of memory devices, at least the memory device to which the signal is initially input being configured to latch the data at the rising edge of the clock; a first logical circuit provided at an input side of the first register group and configured to output 0 when the data is 0 and the strobe is 1, to output 1 when the data is 1 and the strobe is 0, and to output a previous value when the data and the strobe are both 0 or both 1; and a second logical circuit provided at an input side of the second register group and configured to output 0 when the data is 0 and the strobe is 0, to output 1 when the data is 1 and the strobe is 1, and to output the previous value when the data and the strobe have different values from each other.

With this configuration, the data latched in the memory device initially receiving the signal in the first register group changes at the rising edge of the clock, and that memory device latches this data at the falling edge of the clock. Similarly, the data latched in the memory device initially receiving the signal in the second register group changes at the falling edge of the clock, and that memory device latches this data at the rising edge of the clock. Thus, the timing at which the memory device initially receiving the signal in each register group latches the data and the timing at which the data latched in the memory device changes differ by substantially a half-period. As a result, it is possible to reliably read the changed data into the memory devices.

A fourth aspect of the present invention is a communication apparatus including the serial-to-parallel conversion circuit described above.

A fifth aspect of the present invention is a program recorded in a computer-readable recording medium for implementing the above-described serial-to-parallel conversion circuit with a programmable semiconductor device.

In each of the aspects described above, the register group may be formed, for example, by connecting a plurality of memory devices in series or in parallel.

Furthermore, the aspects described above can be used in combination within the permissible scope of the invention.

The present invention affords an advantage in that it is possible to eliminate a race condition without restricting the reception speed.

BRIEF DESCRIPTION OF THE SEVERAL VIEWS OF THE DRAWINGS

FIG. 14 is a diagram showing an example when part of the serial-to-parallel conversion circuit shown in FIG. 4 is represented in VHDL.

DETAILED DESCRIPTION OF THE INVENTION

Embodiments of a method of designing a serial-to-parallel conversion circuit, a serial-to-parallel conversion circuit designed thereby, a communication apparatus, and a program according to the present invention will be described below with reference to the drawings.

Figure 1:
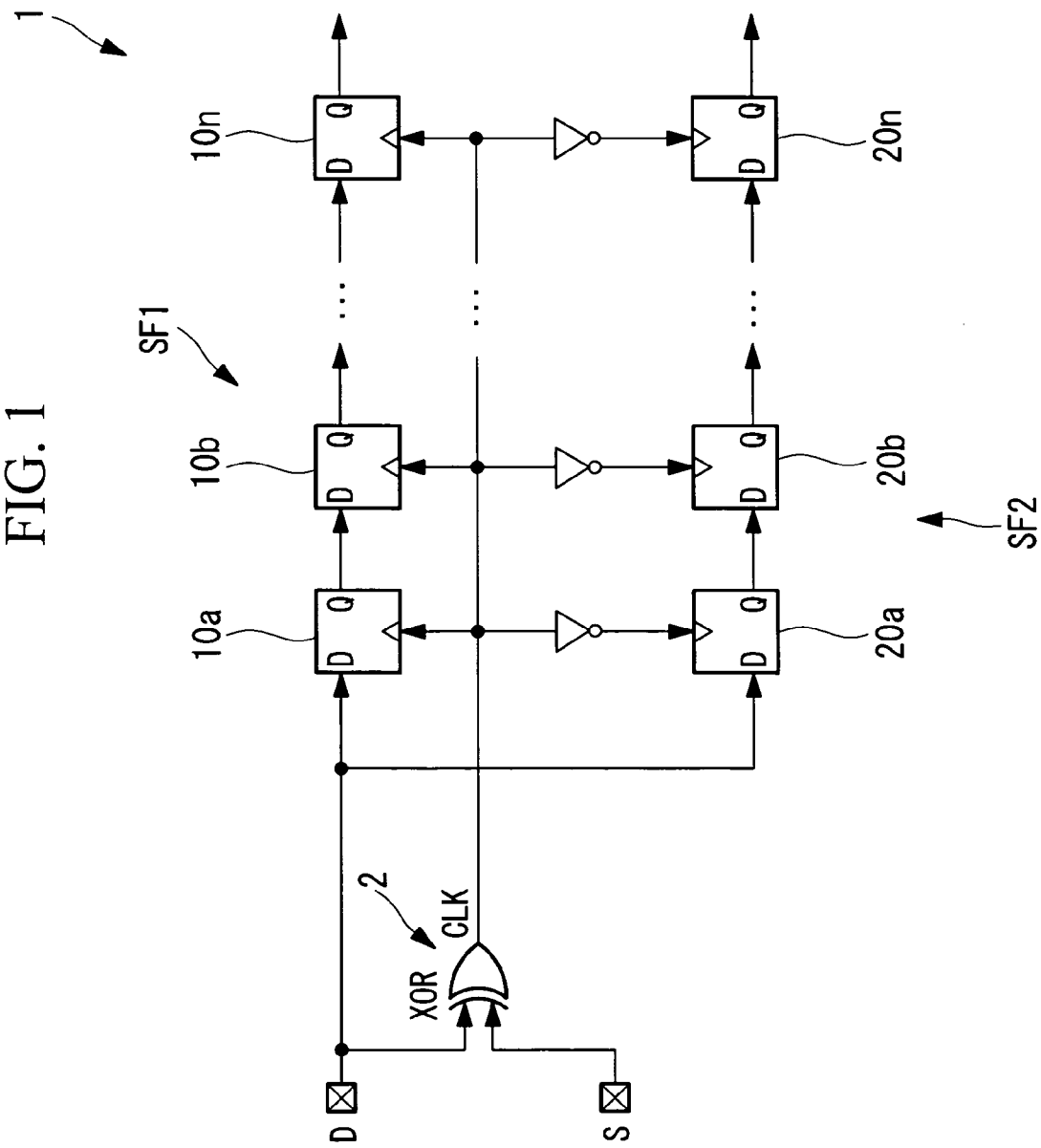
FIG. 1 is a diagram showing, in outline, the configuration of a serial-to-parallel conversion circuit.

FIG. 1 shows, in outline, the configuration of a serial-to-parallel conversion circuit 1 for a case using a shift register formed of a plurality of memory devices connected in series to serve as a register group. As shown in FIG. 1, the serial-to-parallel conversion circuit 1 includes a clock generator 2, which generates a clock CLK by taking the exclusive OR (XOR) of data D and a strobe S received from a transmitter (not shown in the drawing), and first and second shift registers SF1 and SF2 which latch data in synchronization with the clock CLK.

The first shift register (first register group) SF1 includes n stages of D flip-flops (memory devices) 10a, 10b, ..., 10n connected in series. The first shift register SF1 is configured to latch the data D at the rising edge of the clock CLK. In the first shift register SF1, the data D latched into the first-stage D flip-flop 10a is sequentially latched into the D flip-flops 10b, ..., 10n in the subsequent stages and is eventually output as n-bit parallel data.

The second shift register (second register group) SF2 includes n stages of D flip-flops (memory devices) 20a, 20b, ..., 20n connected in series. The second shift register SF2 is configured to latch the data D at the falling edge of the clock CLK. In the second shift register SF2, the data D latched into the first-stage D flip-flop 20a is sequentially latched into the D flip-flops 20b, ..., 20n in the subsequent stages and is eventually output as n-bit parallel data.

This embodiment has been illustrated in terms of an example in which the memory devices are connected in series; however, the memory devices may be connected in parallel. Additionally, the register group in the present invention is not limited to the shift register described above; any other known configuration that is used in serial-to-parallel conversion may be employed.

Figure 2:
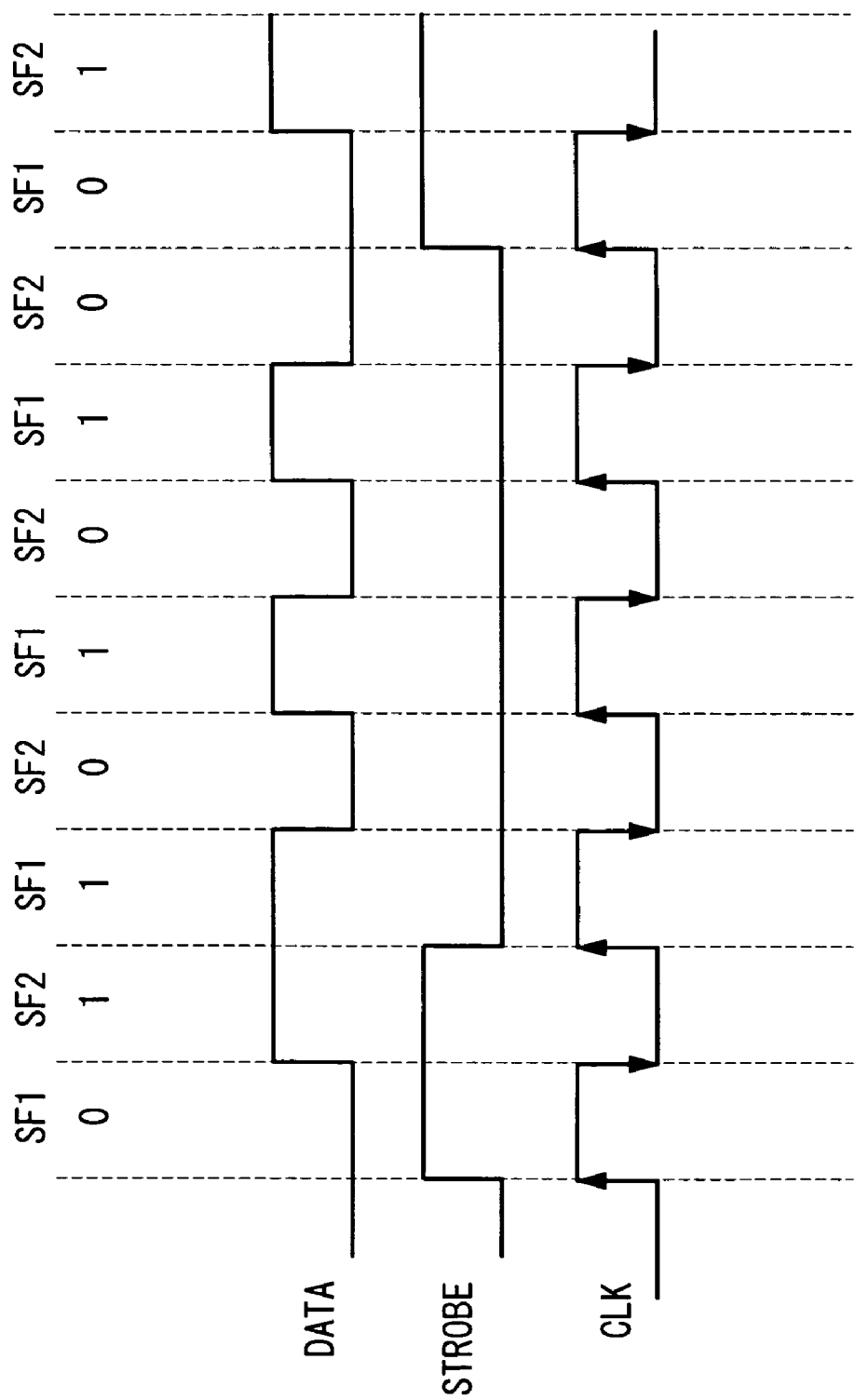
FIG. 2 is a diagram showing a timing chart of the serial-to-parallel conversion circuit shown in FIG. 1.

FIG. 2 shows a timing chart of the serial-to-parallel conversion circuit illustrated in FIG. 1. As shown in FIG. 2, the serial data D is latched into the D flip-flop 10a in the first shift register SF1 at the rising edge of the clock CLK, and the serial data D is latched into the D flip-flop 20a in the second shift register SF2 at the falling edge of the clock CLK. Thus, because the serial-to-parallel conversion circuit 1 alternately latches the serial data D into the first shift register SF1 and the second shift register SF2 in synchronization with the rising edge and the falling edge of the clock CLK, an advantage is afforded in that it is possible to increase the reception speed.

However, the serial-to-parallel conversion circuit 1 shown in FIG. 1 suffers from the so-called race condition problem.

Figure 3:
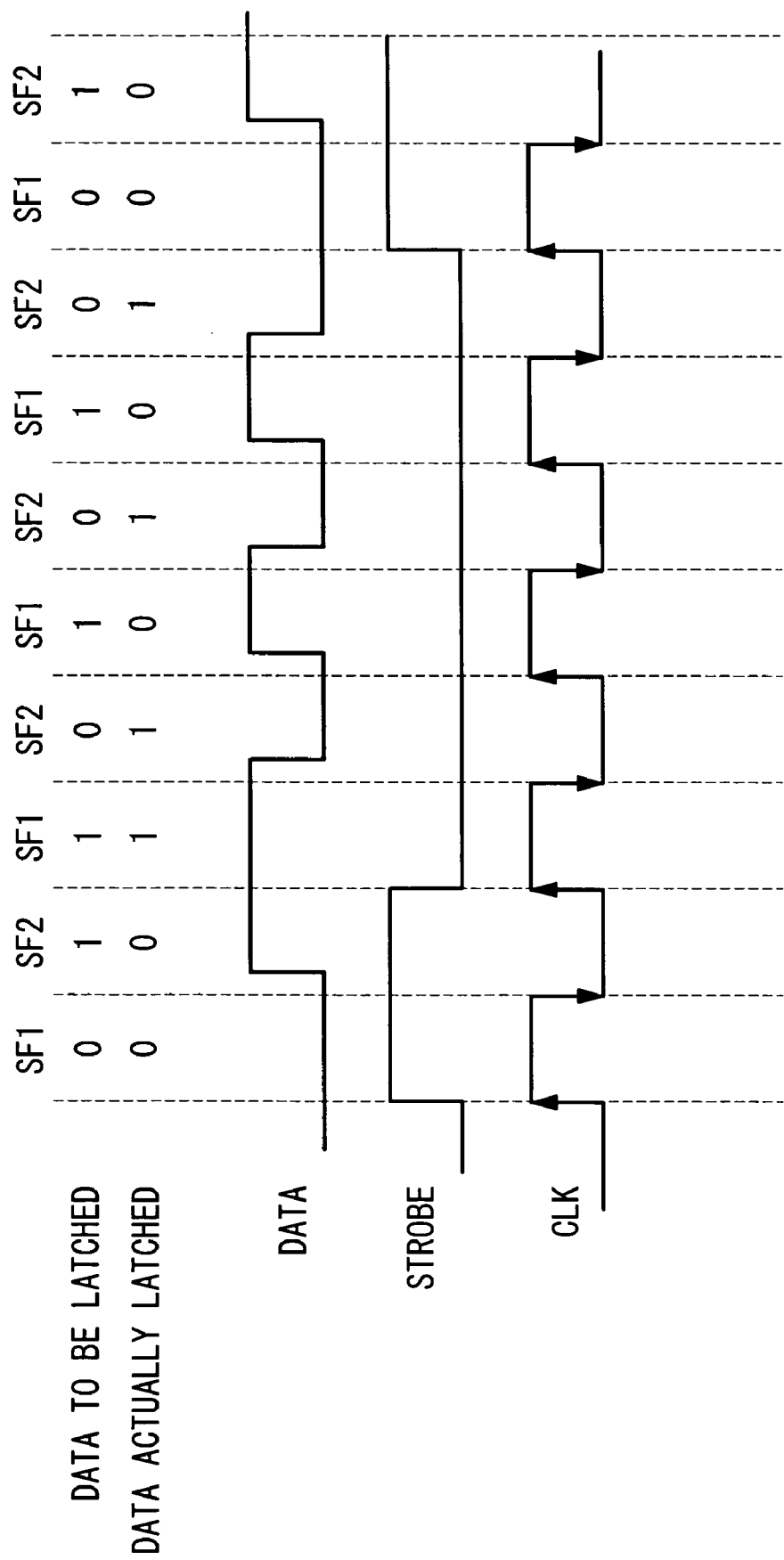
FIG. 3 is a timing chart for explaining a race condition experienced in the serial-to-parallel conversion circuit shown in FIG. 1.

In other words, in the serial-to-parallel conversion circuit 1 shown in FIG. 1, there is no guarantee of the clock CLK reaching the D flip-flops 10a and 20a after the data D changes. Thus, as shown in FIG. 3, when the clock CLK reaches the D flip-flops 10a and 20a earlier than the data D, the data D before the change is latched into the D flip-flops 10a and 20a, causing a difference between the original data to be latched and the data actually latched.

In order to avoid such a race condition, in the method of designing a serial-to-parallel conversion circuit according to this embodiment, the following logical circuit is provided.

Specifically, focusing on the operation of the first-stage D flip-flop 10a in the first shift register SF1, first a rule is determined based on the fact that the logical values of the data and the strobe are guaranteed not to change substantially simultaneously when this D flip-flop 10a holds data, then a logical circuit (first logical circuit) that performs output conforming to this rule is provided at the input side of the first shift register SF1, and of the n stages of D flip-flops 10a to 10n constituting the first shift register SF1, the data latch timing of at least the first-stage D flip-flop 10a is shifted by a half-period; in other words, the data D is latched at the falling edge.

Similarly, focusing on the operation of the first-stage D flip-flop 20a in the second shift register SF2, a rule is determined based of the fact that the logical values of the data and the strobe are guaranteed not to change substantially simultaneously when this D flip-flop 20a holds data, then a logical circuit (second logical circuit) that performs output conforming to this rule is provided at the input side of the second shift register SF2, and of the n stages of D flip-flops 20a to 20n constituting the second shift register SF2, the data latch timing of at least the first-stage D flip-flop 20a is shifted by a half-period; in other words, the data D is latched at the rising edge.

Figure 4:
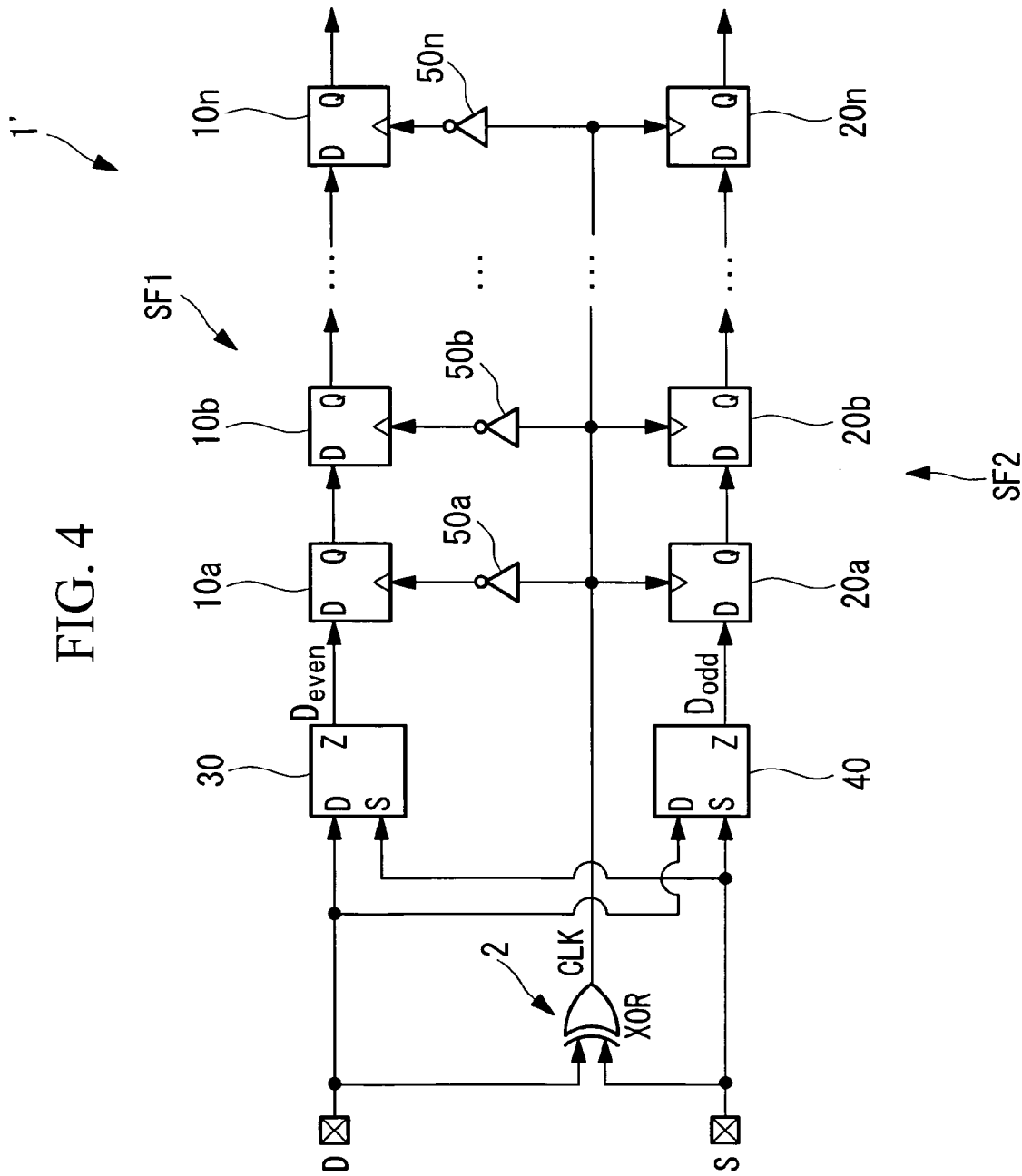
FIG. 4 is a diagram showing, in outline, the configuration of a serial-to-parallel conversion circuit according to an embodiment of the present invention.

Accordingly, for example, the serial-to-parallel conversion circuit 1 shown in FIG. 1 becomes a serial-to-parallel conversion circuit 1' like that shown in FIG. 4.

In FIG. 4, reference numeral 30 is a logical circuit (first logical circuit) that performs output according to the operating rule of the D flip-flop 10a, and reference numeral 40 is a logical circuit (second logical circuit) for performing output according to the operating rule of the D flip-flop 20a. Inverting circuits 50a to 50n for inverting the clock CLK are respectively provided in clock input lines of the D flip-flops 10a to 10n constituting the first shift register SF1. Accordingly, the D flip-flops 10a to 10n sequentially latch data Deven output from the logical circuit 30 at the falling edge of the clock CLK.

By eliminating the inverting circuits from the clock input lines of the D flip-flops 20a to 20n constituting the second shift register SF2, the data latch timing of the D flip-flops 20a to 20n is the rising edge of the clock CLK.

Next, the logical circuit 30 will be described in detail.

Figures 5, 6:
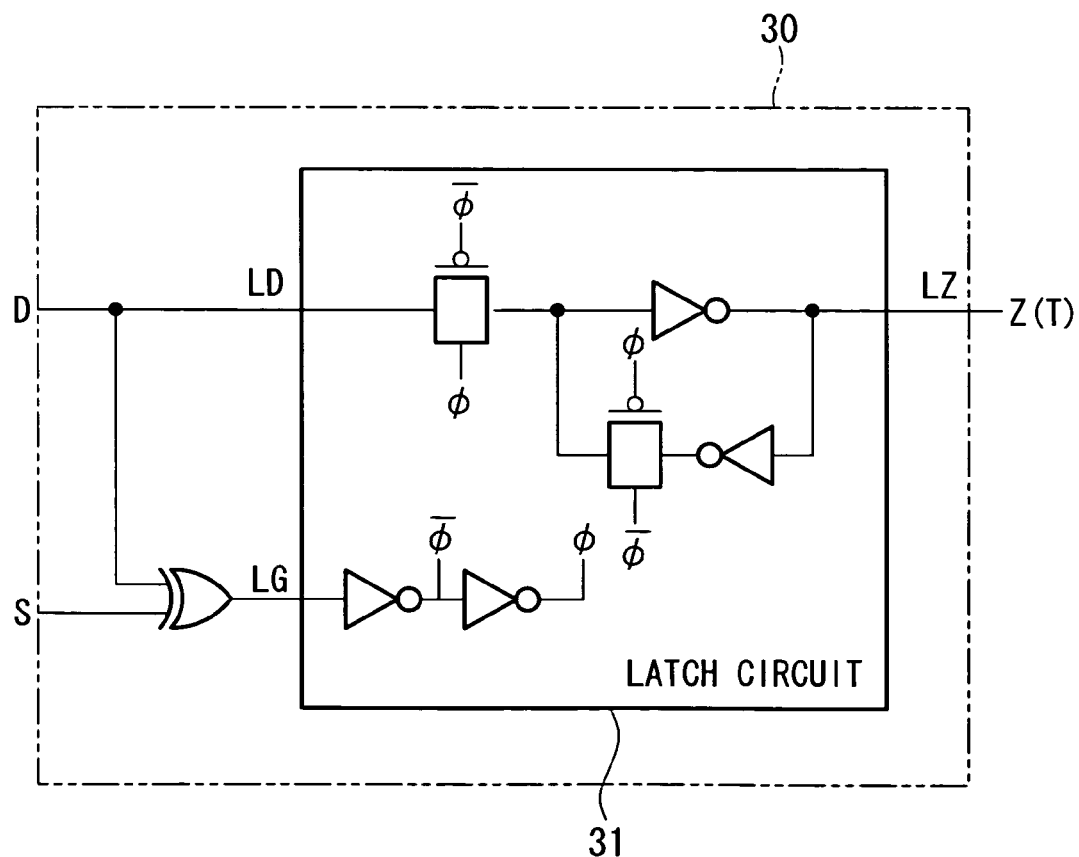
FIG. 5 is a diagram showing an operating rule of a first-stage D flip-flop in a first shift register, in the form of a table.
FIG. 6 is a diagram showing an example configuration of a logical circuit provided at an input side of the first shift register.

First, focusing on the operation of the D flip-flop 10a shown in FIG. 1, the data D is latched at the rising edge of the clock CLK, and the latched data D is held until the next rising edge of the clock CLK. The clock CLK rises, in other words the output of the exclusive OR (XOR) goes to "1", when the data D is "1" and the strobe S is "0", and when the data D is "0" and the strobe S is "1". The output of the exclusive OR (XOR) goes to "0" when the data D and the strobe S have the same values. FIG. 5 shows the operating rule of the D flip-flop 10a described above.

As can be seen from FIG. 5, when the data D is "0" and the strobe S is "1", the data D to be input to the D flip-flop 10a is always "0"; and when the data D is "1" and the strobe S is "0", the data D to be input to the D flip-flop 10a is always "1". In other cases, the previous value Z(T-1) is preserved.

FIG. 6 shows an example configuration of the logical circuit 30 generating an output conforming to the rule shown in FIG. 5.

As shown in FIG. 6, the logical circuit 30 includes a latch circuit 31 having two input terminals LD and LG and one output terminal LZ. The data D is input to the input terminal LD of the latch circuit 31, and a signal obtained by taking the exclusive OR of the data D and the strobe S is input to the input terminal LG thereof.

With this configuration, when the values of the data D and the strobe S are different, the data D is output from the output terminal LZ, and when the values of the data D and the strobe S are the same, the previous value Z(T-1) is preserved.

Figures 7, 8:
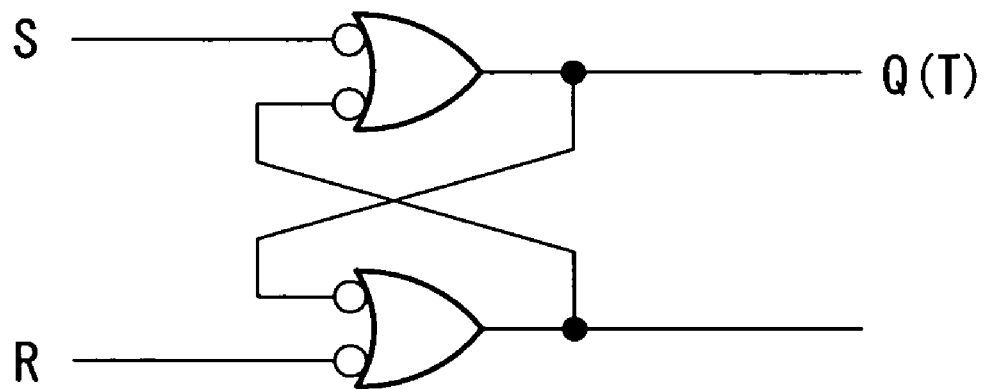
FIG. 7 is a diagram showing an example configuration of an RS flip-flop.
FIG. 8 is a diagram showing a truth table for the RS flip-flop shown in FIG. 7.
Figures 9, 10:
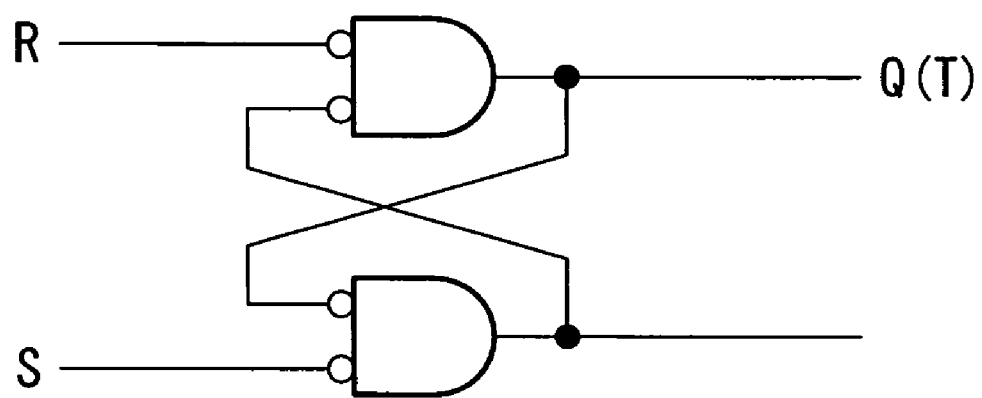
FIG. 9 is a diagram showing another example configuration of an RS flip-flop.
FIG. 10 is a diagram showing a truth table for the RS flip-flop shown in FIG. 9.
Figure 19:
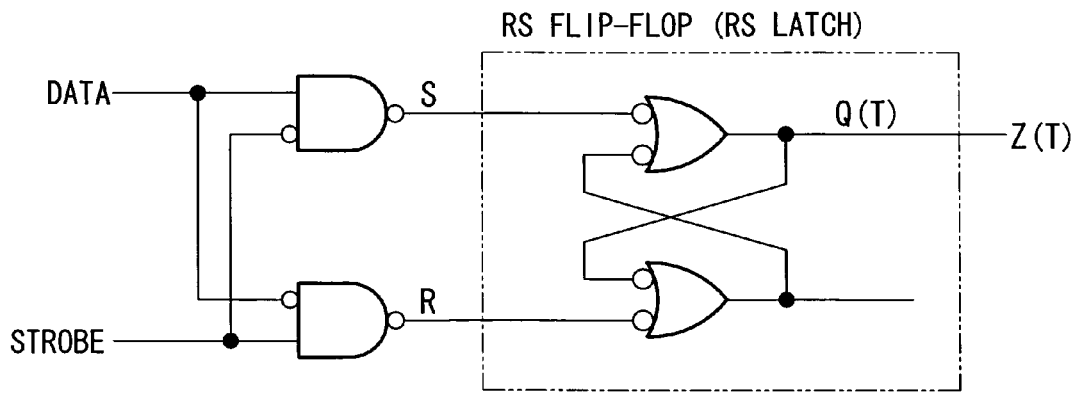
FIG. 19 is a diagram showing another example configuration of a logical circuit in the case where the RS flip-flop shown in FIG. 7 is used.
Figure 20:
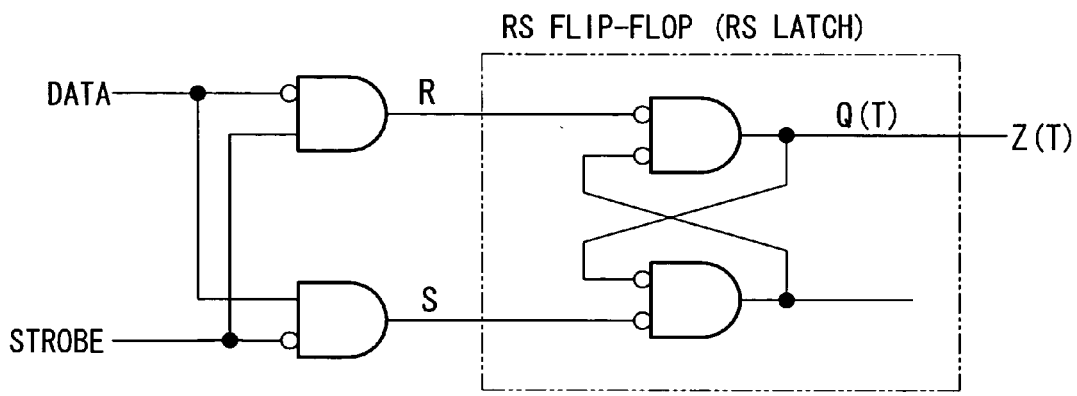
FIG. 20 is a diagram showing another example configuration of a logical circuit in the case where the RS flip-flop shown in FIG. 9 is used.

The logical circuit 30 is not limited to the example configuration described above; it can be easily realized by combinational logic. For example, as shown in FIGS. 19 and 20, it can easily be realized by using an RS flip-flop (RS latch) or the like such as those shown in FIGS. 7 and 9. FIG. 8 shows a truth table of the RS flip-flop illustrated in FIG. 7, and FIG. 10 shows a truth table of the RS flip-flop illustrated in FIG. 9.

Next, the logical circuit 40 will be described in detail.

Figures 11, 12:
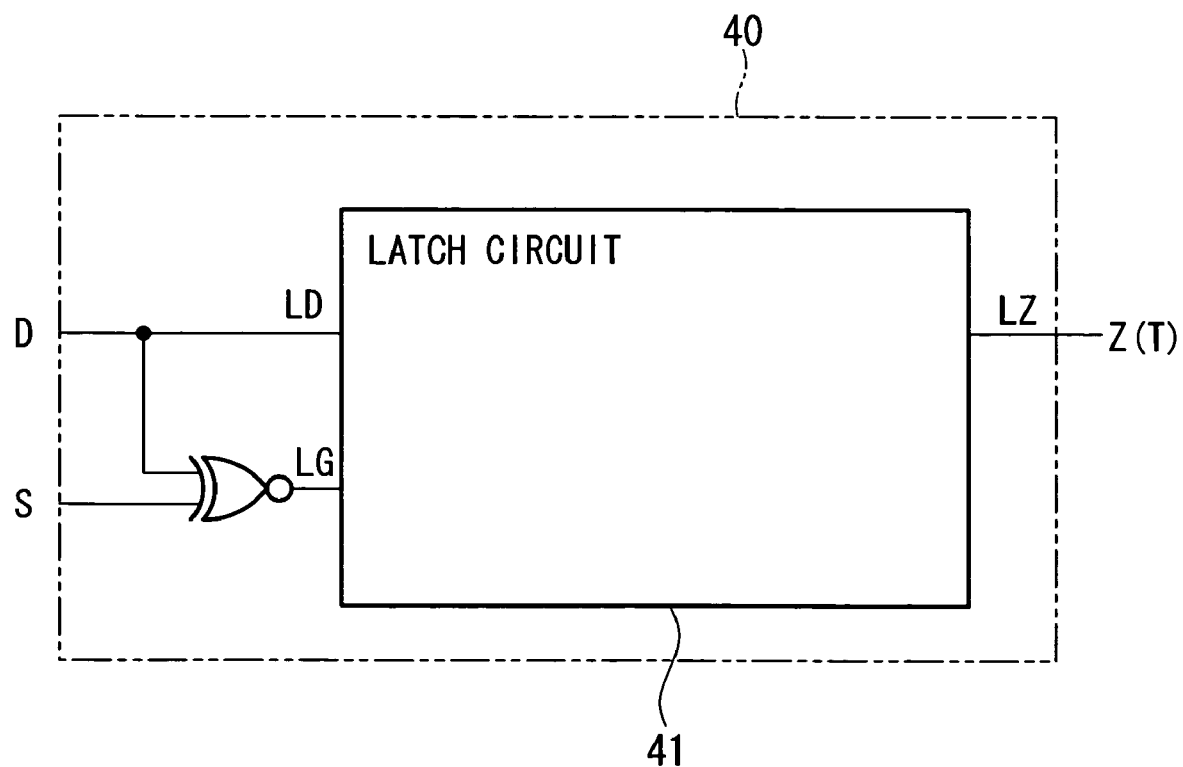
FIG. 11 is a diagram showing an operating rule of a first-stage D flip-flop in a second shift register, in the form of a table.
FIG. 12 is a diagram showing an example configuration of a logical circuit provided at an input side of the second shift register.

Focusing on the operation of the D flip-flop 20a, the data D is latched at the falling edge of the clock CLK, and the latched data D is held until the next falling edge of the clock CLK. The clock CLK falls, in other words the output of the exclusive OR (XOR) goes to "0", when the data D is "0" and the strobe S is "0", and when the data D is "1" and the strobe S is "1". The output of the exclusive OR (XOR) goes to "0" when the data D and the strobe S have different values. FIG. 11 shows the operating rule of the D flip-flop 20a described above.

As can be seen from FIG. 11, when the data D is "0" and the strobe S is "0", the data D to be input to the D flip-flop 20a is always "0"; and when the data D is "1" and the strobe S is "1", the data D to be input to the D flip-flop 20a is always "1". In other cases, the previous value Z(T-1) is preserved.

FIG. 12 shows an example configuration of the logical circuit 40 generating an output conforming to the rule shown in FIG. 11.

As shown in FIG. 12, the logical circuit 40 includes a latch circuit 41 having two input terminals LD and LG and one output terminal LZ. This latch circuit 41 has the same configuration as the latch circuit 31 shown in FIG. 6, for instance.

The data D is input to the input terminal LD of the latch circuit 41, and a signal obtained by inverting the exclusive OR of the data D and the strobe S is input to the input terminal LG thereof.

With this configuration, when the values of the data D and the strobe S are the same, the data D is output from the output terminal LZ, and when the values of the data D and the strobe S are different, the previous value Z(T-1) is preserved.

Figure 21:
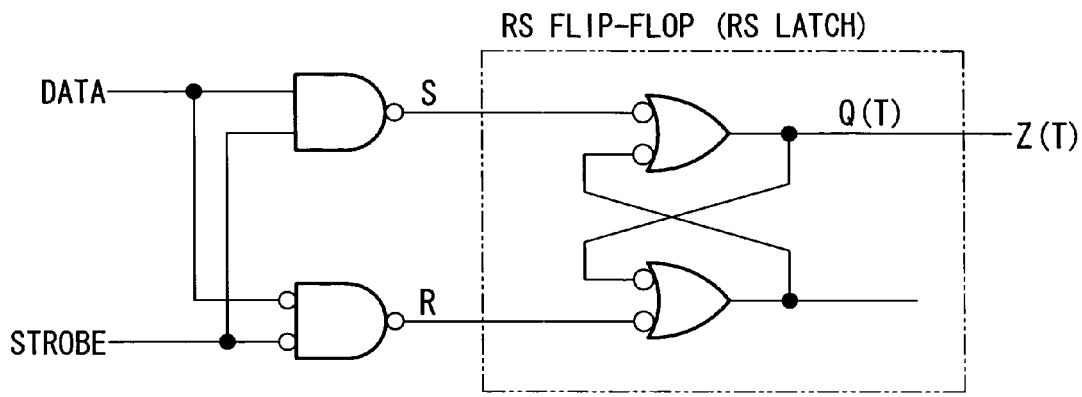
FIG. 21 is a diagram showing another example configuration of a logical circuit in the case where the RS flip-flop shown in FIG. 7 is used.
Figure 22:
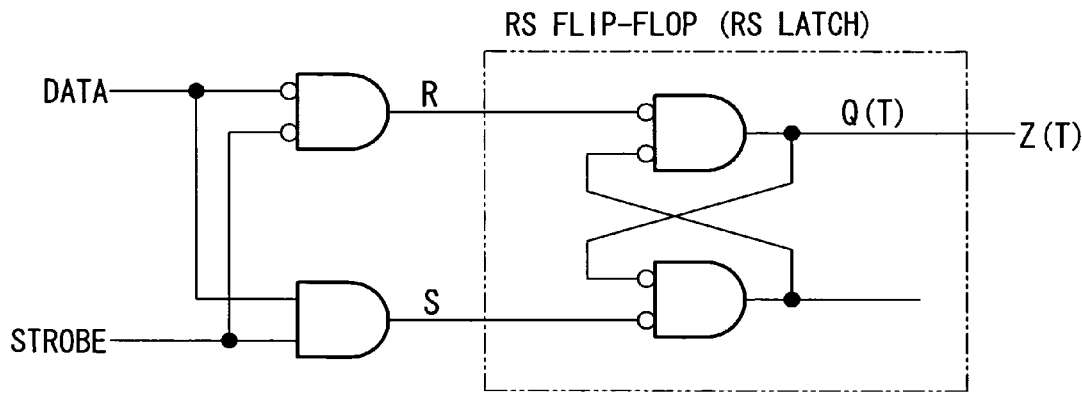
FIG. 22 is a diagram showing another example configuration of a logical circuit in the case where the RS flip-flop shown in FIG. 9 is used.

The logical circuit 40 is not limited to the example configuration described above; it can be easily realized by combinational logic. For example, as shown in FIGS. 21 and 22, it can easily be realized by using an RS flip-flop (RS latch) or the like, such as those shown in FIGS. 7 and 9.

Figure 13:
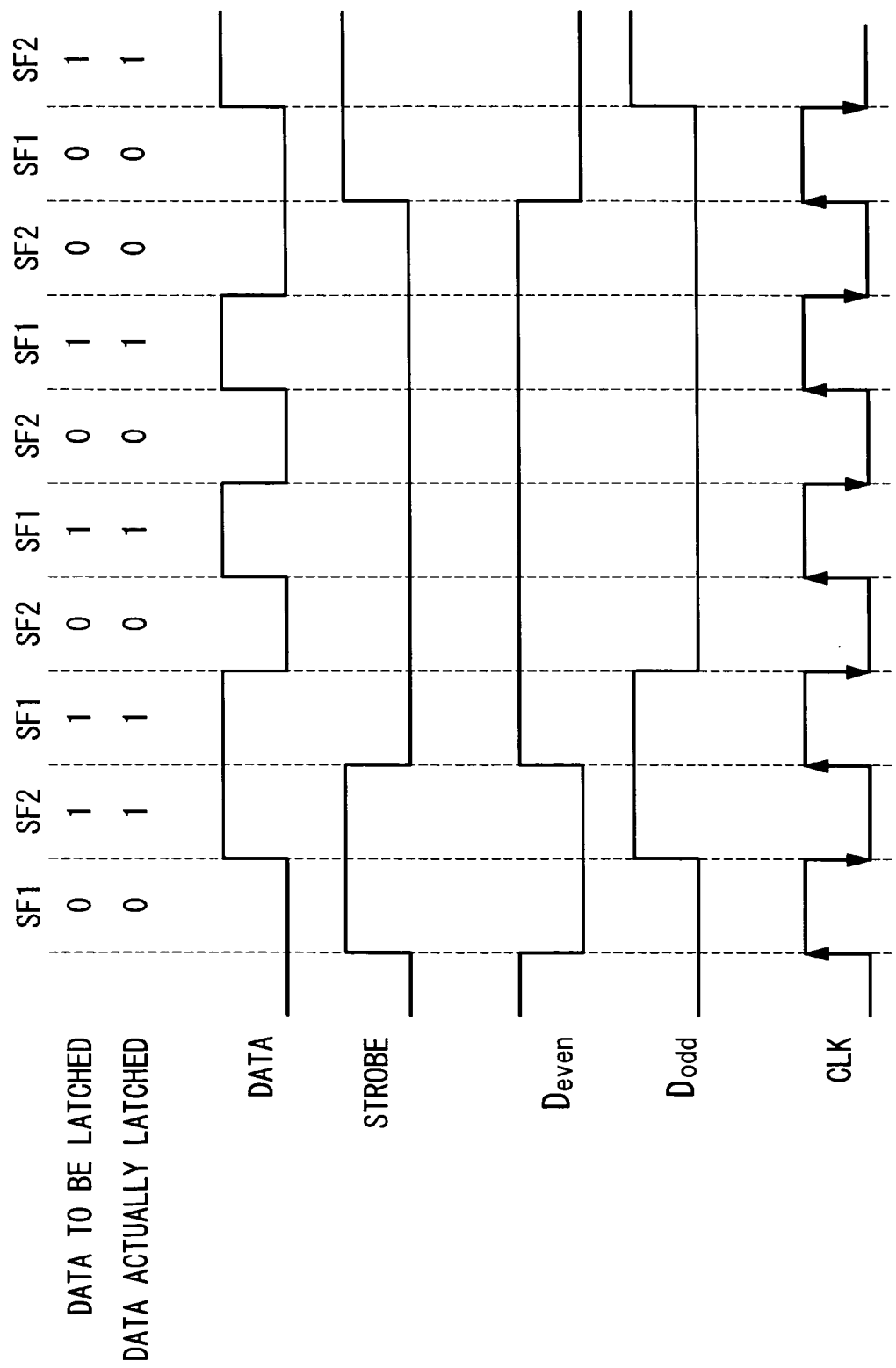
FIG. 13 is a diagram showing a timing chart for the serial-to-parallel conversion circuit shown in FIG. 4.
Figure 15:
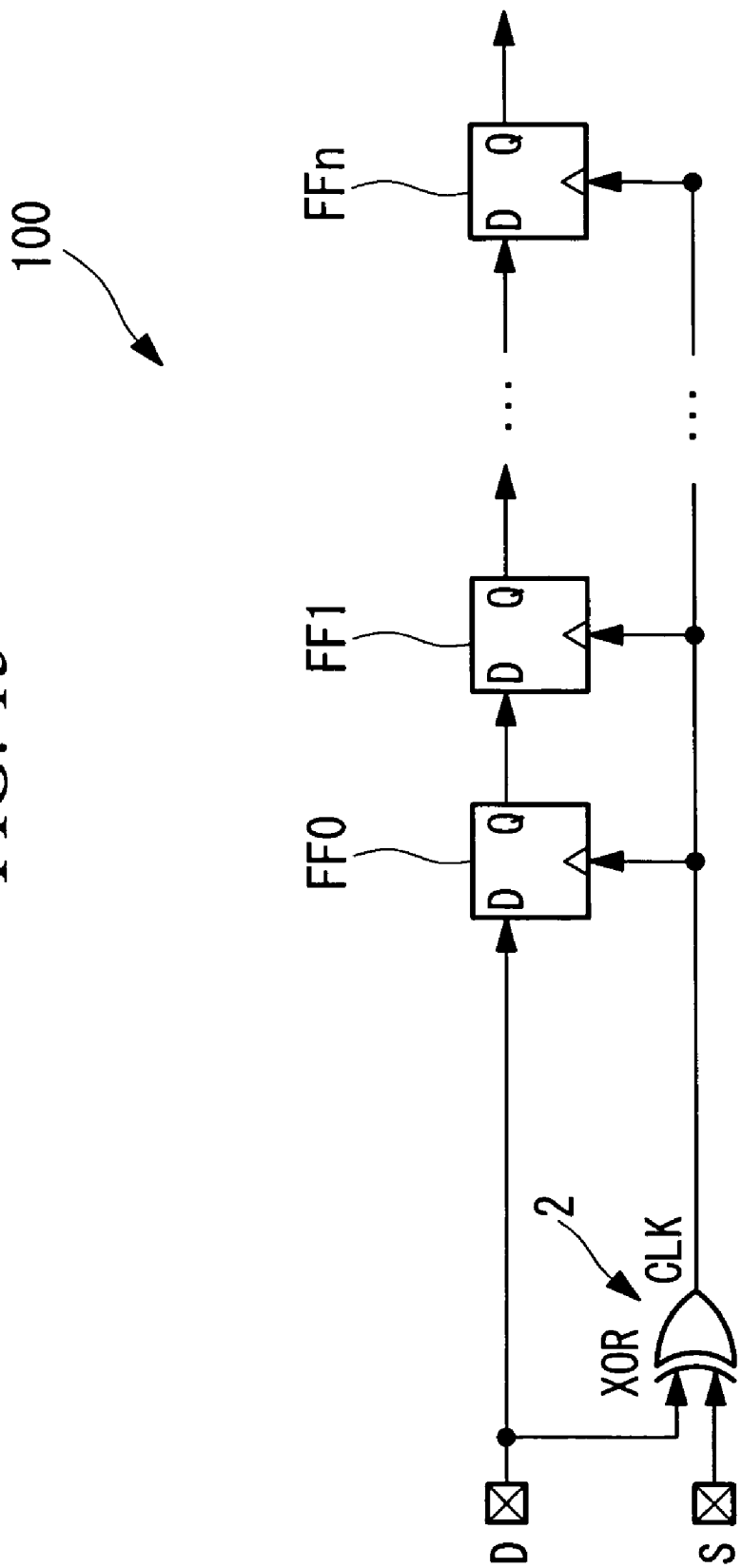
FIG. 15 is a diagram showing, in outline, the configuration of a general serial-to-parallel conversion circuit.
Figure 16:
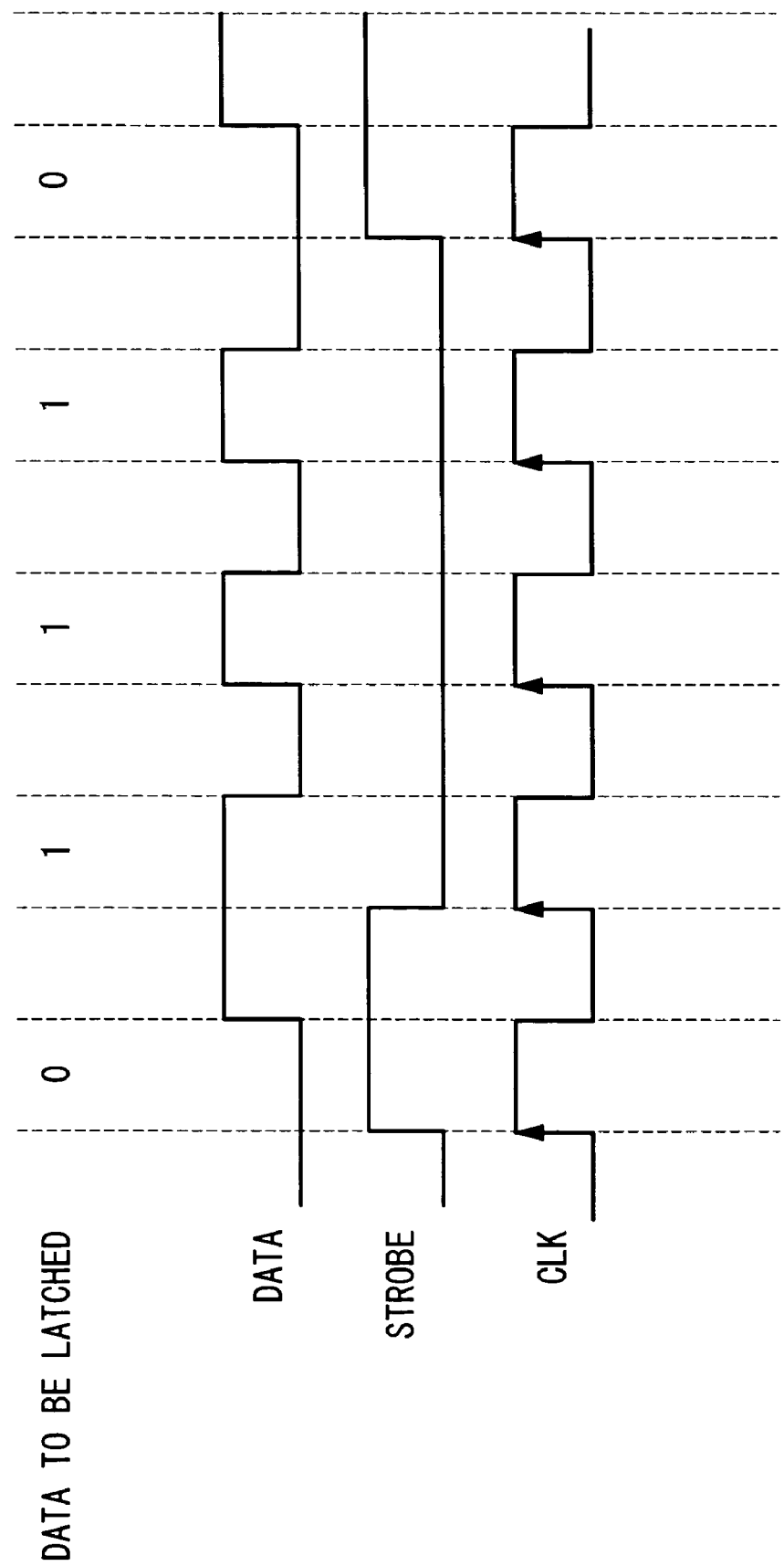
FIG. 16 is a diagram showing a timing chart of the serial-to-parallel conversion circuit shown in FIG. 15.
Figure 17:
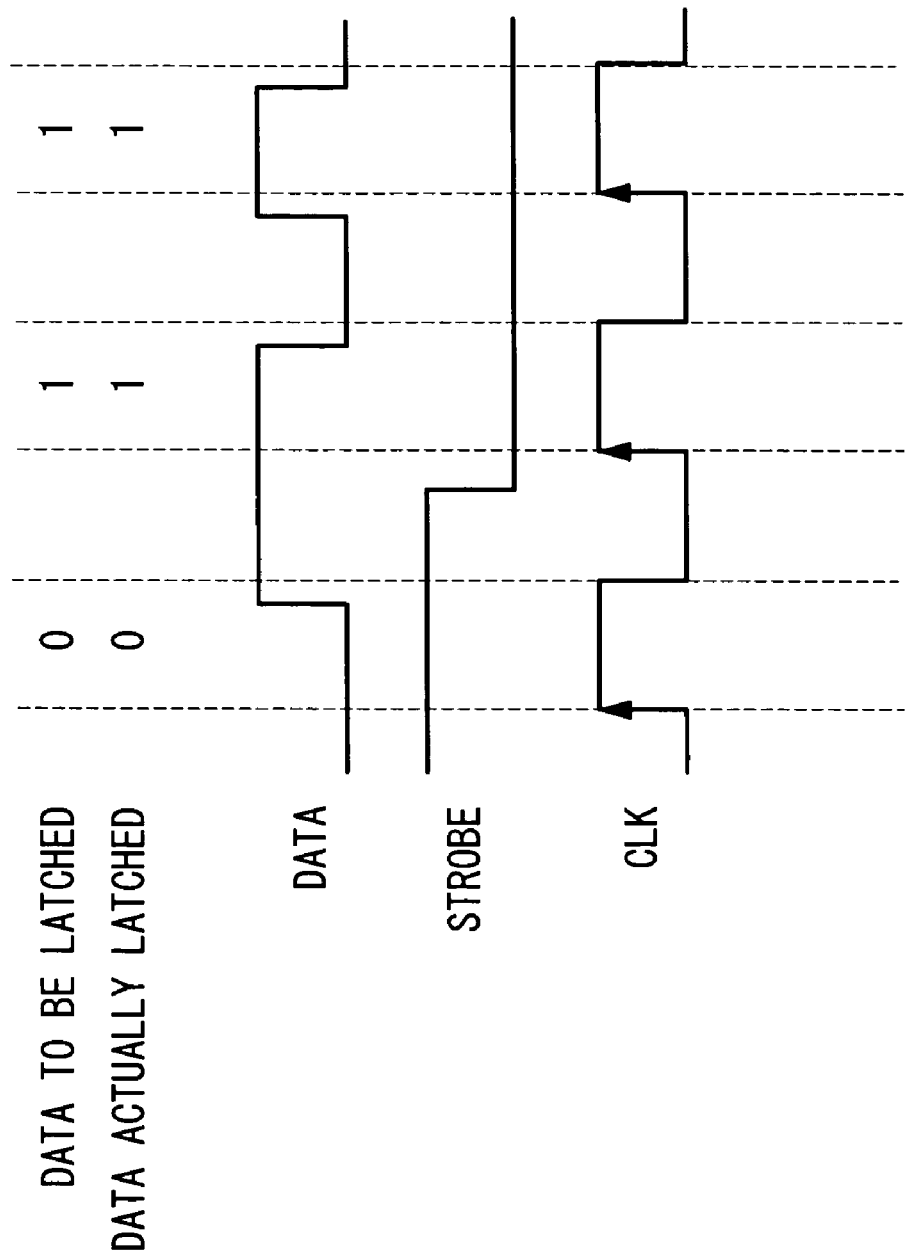
FIG. 17 is a diagram for explaining a race condition experienced in the serial-to-parallel conversion circuit shown in FIG. 15.
Figure 18:
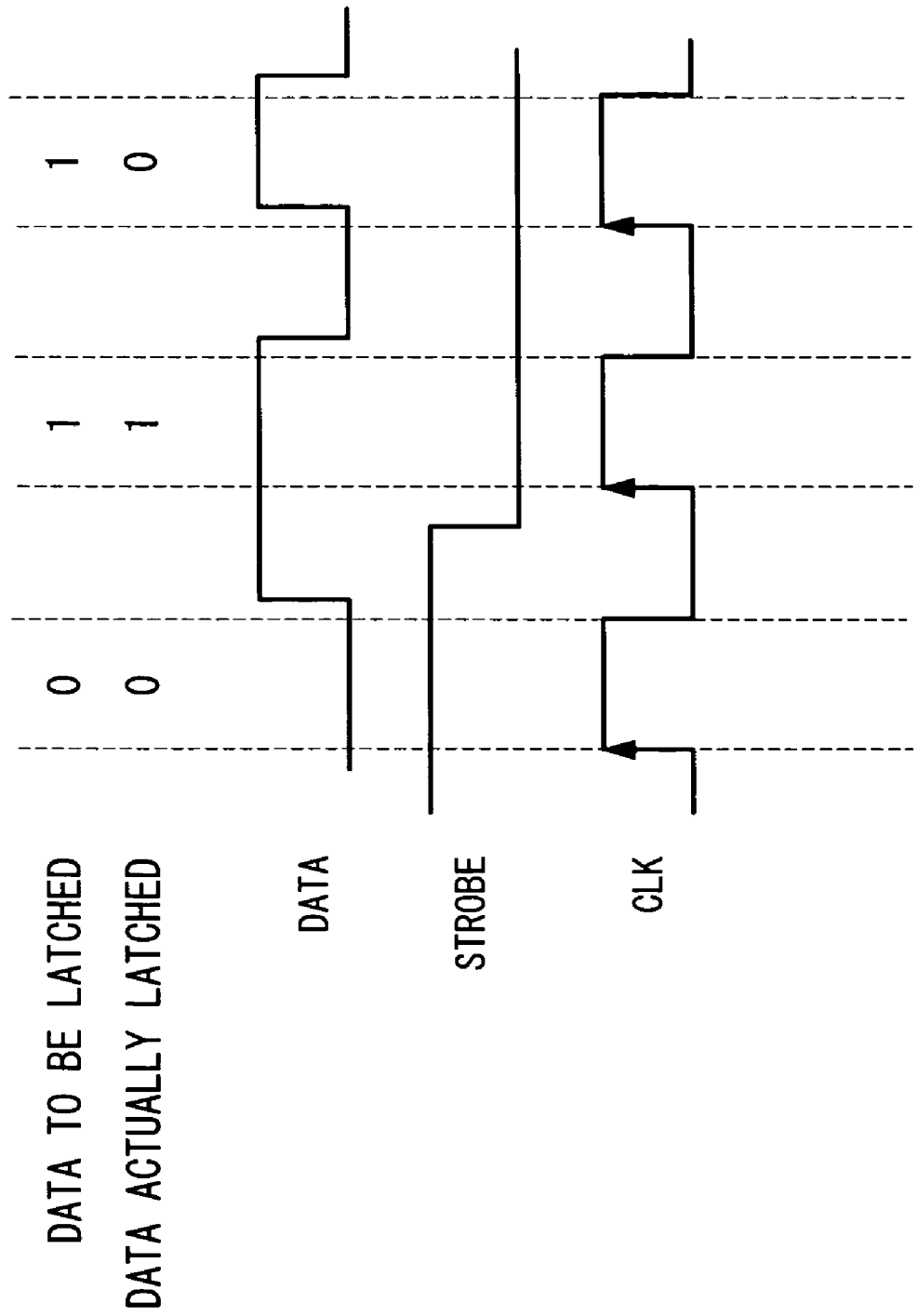
FIG. 18 is a diagram for explaining a race condition experienced in the serial-to-parallel conversion circuit shown in FIG. 15.

FIG. 13 shows a timing chart of the serial-to-parallel conversion circuit shown in FIG. 4, in other words, the serial-to-parallel conversion circuit according to an embodiment of the present invention.

As shown in FIG. 13, substantially a half-period before the falling edge of the clock CLK, the output Deven of the logical circuit 30 has already changed in response to the data D, and the output Deven is preserved until the next rising edge of the clock CLK. Therefore, even if the phase of the clock CLK shifts to some extent due to transmission line factors etc., the D flip-flop 10a can reliably latch the data to be latched. Likewise, substantially a half-period before the rising edge of the clock CLK, the output Dodd of the logical circuit 40 has already changed according to the data D, and the output Dodd is preserved until the next falling edge of the clock CLK. Therefore, even if the phase of the clock CLK shifts to some extent due to transmission line factors etc., the D flip-flop 20a can reliably latch the data to be latched.

As described above, with the serial-to-parallel conversion circuit 1' and the method of designing a serial-to-parallel conversion circuit according to this embodiment, because the timing at which the data changes and the timing at which the data is latched are shifted by a half-period, as shown in FIG. 13, it is possible to reliably latch the changed data into the first-stage flip-flops 10a and 20a. Accordingly, it is possible to eliminate the race condition problem.

Furthermore, because no delay circuits are employed, it is possible to easily realize the serial-to-parallel conversion circuit according to this embodiment with general-purpose programmable semiconductor devices such as CPLDs (Complex PLDs), FPGAs (Field Programmable Gate Arrays), etc. Additionally, by eliminating the race condition problem using a method other than delay circuits, the reception speed is not restricted, and it is thus possible to achieve high-bit-rate communication that is optimal for the prevailing communication environment.

In the embodiment described above, an n-bit shift register is constructed using D flip-flops; however, the shift register configuration is not limited thereto. For example, it is possible to construct the shift register using other types of memory device, such as JK flip-flops or the like.

Also, the individual memory devices constituting the shift register need not always latch the data at the same timing. For example, it is also possible to use a configuration in which the first-stage flip-flop 10a latches the data Deven at the falling edge of the clock CLK in FIG. 4, whereas the other flip-flops 10b to 10n latch the data from the first-stage flip-flop 10a at the rising edge of the clock CLK.

Although this embodiment has been illustrated using the case of a shift register as an example, the serial-to-parallel conversion circuit may be constructed using other types of registers.

The serial-to-parallel conversion circuit 1' according to the embodiment described above is suitable for use in communication devices. Examples of such communication devices include routers, data communication terminals between computers, data communication terminals between devices, communication devices for remote sensing, and communication devices for data storage. The communication devices are not limited to terrestrial devices, but also include devices used in various environments, such as space.

In the case where the serial-to-parallel conversion circuit 1' according to the embodiment of the present invention shown in FIG. 4 is realized by general-purpose programmable semiconductor devices such as CPLDs (Complex PLDs) and FPGAs (Field Programmable Gate Arrays), hardware design is performed using a hardware description language or the like. Examples of such a hardware description language include VHDL or Verilog HLD.

FIG. 14 shows one example when part of the serial-to-parallel conversion circuit 1' is represented in VHDL. By performing programming using a hardware description language such as VHDL in this way, it is possible to easily realize the serial-to-parallel conversion circuit 1' according to the embodiment shown in FIG. 4. In FIG. 14, the flip-flop 10a shown in FIG. 4 is represented by "FF0", and the flip-flop 10b is represented by "FF2".

While the embodiment of the present invention has been described above with reference to the drawings, the specific configuration is not limited to this embodiments. Design changes and other modifications are possible so long as they do not depart from the spirit of the invention.

What is claimed is:

1. A method of designing a serial-to-parallel conversion circuit including a clock generator configured to generate a clock by taking the exclusive OR of received data and a strobe, and a register group including a plurality of memory devices sequentially latching the data in synchronization with a rising edge and a falling edge of the clock, the method comprising:
   determining a rule on the basis of the fact that logical values of the data and the strobe are guaranteed not to change substantially simultaneously when the memory devices of the register group latch the data and when the memory devices hold the data;
   providing a logical circuit configured to generate an output conforming to the rule at a data input side of the register group; and
   delaying data latch timing of the memory devices later than timing at which data input to the memory devices changes.

2. A method of designing a serial-to-parallel conversion circuit according to claim 1, wherein when the memory device initially receiving a signal in the register group latches the data at the rising edge of the clock, the logical circuit outputs 0 when the data is 0 and the strobe is 1, outputs 1 when the data is 1 and the strobe is 0, and outputs a previous value when the data and the strobe are both 0 or both 1.

3. A method of designing a serial-to-parallel conversion circuit according to claim 1, wherein when the memory device initially receiving a signal in the register group latches the data at the falling edge of the clock, the logical circuit outputs 0 when the data is 0 and the strobe is 0, outputs 1 when the data is 1 and the strobe is 1, and outputs a previous value when the data and the strobe have different values from each other.

4. A method of designing a serial-to-parallel conversion circuit according to claim 1, further comprising:
   setting a timing at which an output from the logical device is latched by the memory device to an edge after a half-period of the clock generated by taking the exclusive OR of the received data and strobe.

5. A serial-to-parallel conversion circuit comprising:
   a clock generator configured to generate a clock by taking the exclusive OR of received data and strobe;
   a register group including a plurality of memory devices and configured to sequentially latch the data in synchronization with a rising edge and a falling edge of the clock; and
   a logical circuit, provided at a data input side of the register group, configured to generate an output conforming to a rule based on the fact that logical values of the data and the strobe are guaranteed not to change substantially simultaneously when the memory devices of the register group latch the data and when the memory devices hold the data,
   wherein data latch timing of the memory devices is delayed later than timing at which data output from the logical circuit changes.

6. A serial-to-parallel conversion circuit according to claim 5, wherein a timing at which the output from the logical circuit is latched by the memory devices is set to an edge after a half-period of the clock generated by taking the exclusive OR of the received data and strobe.

7. A serial-to-parallel conversion circuit according to claim 5, wherein:
   when the memory device initially receiving a signal in the register group latches the data at the rising edge of the clock, the logical circuit outputs 0 when the data is 0 and the strobe is 1, outputs 1 when the data is 1 and the strobe is 0, and outputs a previous value when the data and the strobe are both 0 or both 1.

8. A serial-to-parallel conversion circuit according to claim 5, wherein:
   when the memory device initially receiving a signal in the register group latches data at the falling edge of the clock, the logical circuit outputs 0 when the data is 0 and the strobe is 0, outputs 1 when the data is 1 and the strobe is 1, and outputs a previous value when the data and the strobe have different values from each other.

9. A serial-to-parallel conversion circuit comprising:
   a clock generator configured to generate a clock by taking the exclusive OR of received data and a strobe;
   a first register group including a plurality of memory devices, at least the memory device to which a signal is initially input being configured to latch the data at the falling edge of the clock;
   a second register group including a plurality of memory devices, at least the memory device to which the signal is initially input being configured to latch the data at the rising edge of the clock;
   a first logical circuit provided at an input side of the first register group and configured to output 0 when the data is 0 and the strobe is 1, to output 1 when the data is 1 and the strobe is 0, and to output a previous value when the data and the strobe are both 0 or both 1; and
   a second logical circuit provided at an input side of the second register group and configured to output 0 when the data is 0 and the strobe is 0, to output 1 when the data is 1 and the strobe is 1, and to output the previous value when the data and the strobe have different values from each other.

10. A communication apparatus comprising a serial-to-parallel conversion circuit according to claim 5.

11. A program recorded in a computer-readable recording medium for implementing a serial-to-parallel conversion circuit according to claim 5 with a programmable semiconductor device.

* * * * *